US011655907B2

(12) United States Patent
Choi et al.

(10) Patent No.: US 11,655,907 B2
(45) Date of Patent: May 23, 2023

(54) SUBSTRATE TREATING APPARATUS AND SAFETY VALVE APPLIED THERETO

(71) Applicant: SEMES CO., LTD., Cheonan-si (KR)

(72) Inventors: Yong-Hyun Choi, Gyeonggi-do (KR); Ki-Bong Kim, Gyeonggi-do (KR); Woo-Young Kim, Chungcheongnam-do (KR)

(73) Assignee: SEMES CO., LTD., Cheonan-si (KR)

( * ) Notice: Subject to any disclaimer, the term of this patent is extended or adjusted under 35 U.S.C. 154(b) by 173 days.

(21) Appl. No.: 16/591,441

(22) Filed: Oct. 2, 2019

(65) Prior Publication Data
US 2020/0103043 A1  Apr. 2, 2020

(30) Foreign Application Priority Data

Oct. 2, 2018  (KR) ........................ 10-2018-0117815

(51) Int. Cl.
*F16K 17/02* (2006.01)
*H01L 21/02* (2006.01)

(52) U.S. Cl.
CPC ........ *F16K 17/02* (2013.01); *H01L 21/02101* (2013.01)

(58) Field of Classification Search
CPC ......... H01L 21/02101; Y10T 137/7922; Y10T 137/7904; Y10T 137/7837; F16K 17/02; F16L 25/00
See application file for complete search history.

(56) References Cited

U.S. PATENT DOCUMENTS

| 5,203,857 | A | * | 4/1993 | Terwilliger | ........... | F04B 39/102 |
| | | | | | | 137/533.29 |
| 5,224,510 | A | * | 7/1993 | Pericles | ................. | G01N 30/20 |
| | | | | | | 137/341 |
| 5,268,102 | A | * | 12/1993 | Clay | .................. | B01D 11/0203 |
| | | | | | | 210/634 |
| 8,813,771 | B2 | * | 8/2014 | Rayment | ................. | F16K 25/00 |
| | | | | | | 137/15.23 |
| 2002/0033465 | A1 | * | 3/2002 | Mori | ..................... | F16K 25/005 |
| | | | | | | 251/368 |

(Continued)

FOREIGN PATENT DOCUMENTS

| CN | 103456663 A | 12/2013 |
| CN | 103456665 A | 12/2013 |

(Continued)

OTHER PUBLICATIONS

Office Action for related Korean Patent Application No. 10-2018-0117815 dated Mar. 18, 2020 (6 pages).
Office Action dated Apr. 6, 2021 from corresponding CN Patent Application No. 201910949254.0, 9 pages.

*Primary Examiner* — Jessica Cahill
(74) *Attorney, Agent, or Firm* — Procopio, Cory, Hargreaves & Savitch LLP (57) ABSTRACT

A safety valve includes a body having a flow passage formed therein, the flow passage including an inlet an outlet, in which a valve seat is formed around the inlet or the outlet, a disc provided in the body, in which one side of the disc is in contact with the valve seat, an elastic member that is connected to an opposite side of the disc and that elastically supports the disc and has a set elasticity, and a sealing member made of polyimide that is provided on contact surfaces of the disc and the valve seat.

19 Claims, 6 Drawing Sheets

(56) References Cited

U.S. PATENT DOCUMENTS

| | | | | |
|---|---|---|---|---|
| 2003/0121608 A1* | 7/2003 | Chen | ............ | C23C 16/45563 156/345.33 |
| 2004/0129013 A1* | 7/2004 | Gilbert | ............ | B60H 1/00585 62/292 |
| 2006/0225811 A1* | 10/2006 | Sheydayi | ............ | F16K 51/02 141/98 |
| 2008/0105309 A1* | 5/2008 | Kuroyanagi | ............ | F16K 1/425 137/505.41 |
| 2008/0257430 A1* | 10/2008 | Best | ............ | F16K 31/0644 137/596.2 |
| 2010/0224804 A1 | 9/2010 | Sneh | | |
| 2012/0273079 A1* | 11/2012 | Guclucan | ............ | F01D 25/18 138/109 |
| 2013/0319484 A1* | 12/2013 | Choi | ............ | H01L 21/67034 134/109 |
| 2015/0034195 A1* | 2/2015 | Shima | ............ | F16K 15/021 137/843 |
| 2015/0303036 A1* | 10/2015 | Jeong | ............ | H01J 37/32513 118/733 |
| 2016/0102771 A1* | 4/2016 | Kuroyanagi | ............ | F16K 47/023 137/540 |
| 2016/0123484 A1* | 5/2016 | Mori | ............ | F16K 47/023 137/512 |
| 2017/0184344 A1* | 6/2017 | Sillince | ............ | F16K 17/403 |
| 2017/0307094 A1 | 10/2017 | Choate | | |
| 2019/0275275 A1* | 9/2019 | Brown | ............ | B01D 53/047 |

FOREIGN PATENT DOCUMENTS

| | | | |
|---|---|---|---|
| CN | 103975184 A | 8/2014 | |
| CN | 107228215 A | 10/2017 | |
| GB | 1180065 A | 2/1970 | |
| JP | H08-254283 A | 10/1996 | |
| JP | 4672871 B2 | 1/2011 | |
| JP | 2016133807 A | 7/2016 | |
| KR | 10-0904462 B1 | 6/2009 | |
| KR | 200447280 Y1 | 1/2010 | |
| KR | 10-1155612 B1 | 6/2012 | |
| KR | 10-2013-0134997 A | 12/2013 | |
| KR | 1020150021165 A | 3/2015 | |
| KR | 10-2016-0046831 A | 4/2016 | |
| KR | 10-1686565 B1 | 12/2016 | |
| KR | 10-1776021 B | 9/2017 | |
| KR | 10-1980590 B | 5/2019 | |
| WO | WO-2010099795 A1 * | 9/2010 | ............ F16K 15/026 |

* cited by examiner

SUBSTRATE TREATING APPARATUS AND SAFETY VALVE APPLIED THERETO

CROSS-REFERENCE TO RELATED APPLICATIONS

A claim for priority under 35 U.S.C. § 119 is made to Korean Patent Application No. 10-2018-0117815 filed on Oct. 2, 2018, in the Korean Intellectual Property Office, the entire contents of which are hereby incorporated by reference.

BACKGROUND

Embodiments of the inventive concept described herein relate to a substrate treating apparatus requiring a high cleanliness level and a safety valve applied thereto.

In a semiconductor device manufacturing process of forming a laminated structure of an integrated circuit on the surface of a substrate such as a semiconductor wafer, liquid processing such as chemical cleaning or wet etching is performed. In recent years, a cleaning or drying method using process fluid in a supercritical state has been used as a method of cleaning or drying a substrate after liquid processing. High-pressure equipment is used to apply supercritical fluid.

High-pressure equipment having an operating pressure of 10 bar or more is equipped with a safety valve (or a relief valve) to enable emergency discharge when pressure exceeding design pressure is generated. A general safety valve has a sealing structure in a rubber-based O-ring shape. However, rubber swells in supercritical fluid to generate a contaminant, and therefore leakage occurs, or lubricant in the safety valve is introduced into a facility to cause a process failure due to oil.

A conventional safety valve is mainly used in general industrial high-pressure equipment. However, the conventional safety valve having a low cleanliness level is inappropriate because semiconductor equipment requires a high cleanliness level.

SUMMARY

Embodiments of the inventive concept provide a substrate treating apparatus for efficiently treating a substrate.

Furthermore, embodiments of the inventive concept provide a substrate treating apparatus for improving cleaning efficiency.

In addition, embodiments of the inventive concept provide a safety valve having a high cleanliness level.

The technical problems to be solved by the inventive concept are not limited to the aforementioned problems, and any other technical problems not mentioned herein will be clearly understood from the following description by those skilled in the art to which the inventive concept pertains.

According to an exemplary embodiment, an apparatus for treating a substrate includes a high-pressure chamber, a fluid supply unit including a supply pipe through which supercritical fluid is supplied into the high-pressure chamber, at least one branch pipe that branches off from the supply pipe of the fluid supply unit and discharges the supercritical fluid to the outside, and a safety valve that is provided between the supply pipe and the at least one branch pipe and that releases pressure in the supply pipe to the at least one branch pipe when the pressure in the supply pipe exceeds an allowable pressure. The safety valve may include a body having a flow passage formed therein, the flow passage including an inlet connected to the supply pipe and an outlet connected to the at least one branch pipe, in which a valve seat is formed around the inlet or the outlet, a disc provided in the body, in which one side of the disc is in contact with the valve seat, an elastic member that is connected to an opposite side of the disc and that elastically supports the disc and has a set elasticity, and a sealing member made of polyimide that is provided on contact surfaces of the disc and the valve seat.

In an embodiment, the disc may vertically move with respect to a contact surface with the valve seat.

In an embodiment, the safety valve may include a primary coupling part coupled to the supply pipe and a secondary coupling part coupled to the at least one branch pipe, and the primary coupling part and the secondary coupling part may be plated with silver.

In an embodiment, the safety valve may include at least one thread, and a surface of the at least one thread may be plated with silver.

In an embodiment, the body of the safety valve may include a first body in which the flow passage is formed and a second body having the elastic member therein. The first body may be screw-coupled with the second body, and screw-coupling surfaces of the first body and the second body may be plated with silver.

In an embodiment, in the contact surfaces of the disc and the body, at least one of the disc and the body may be plated with silver.

In an embodiment, the sealing member may be provided in a seat shape.

In an embodiment, the sealing member may be provided on the valve seat.

In an embodiment, the sealing member may be provided on the disc.

In an embodiment, lubricant may not be applied to the safety valve.

According to an exemplary embodiment, a safety valve includes a body having a flow passage formed therein, the flow passage including an inlet an outlet, in which a valve seat is formed around the inlet or the outlet, a disc provided in the body, in which one side of the disc is in contact with the valve seat, an elastic member that is connected to an opposite side of the disc and that elastically supports the disc and has a set elasticity, and a sealing member made of polyimide that is provided on contact surfaces of the disc and the valve seat.

In an embodiment, the safety valve may be provided in a pipe through which supercritical fluid used to treat a substrate flows.

In an embodiment, the disc may vertically move with respect to a contact surface with the valve seat.

In an embodiment, the safety valve may include at least one thread, and a surface of the at least one thread may be plated with silver.

In an embodiment, the body may include a first body in which the flow passage is formed and a second body having the elastic member therein. The first body may be screw-coupled with the second body, and screw-coupling surfaces of the first body and the second body may be plated with silver.

In an embodiment, in the contact surfaces of the disc and the body, at least one of the disc and the body may be plated with silver.

In an embodiment, lubricant may not be applied to the safety valve.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
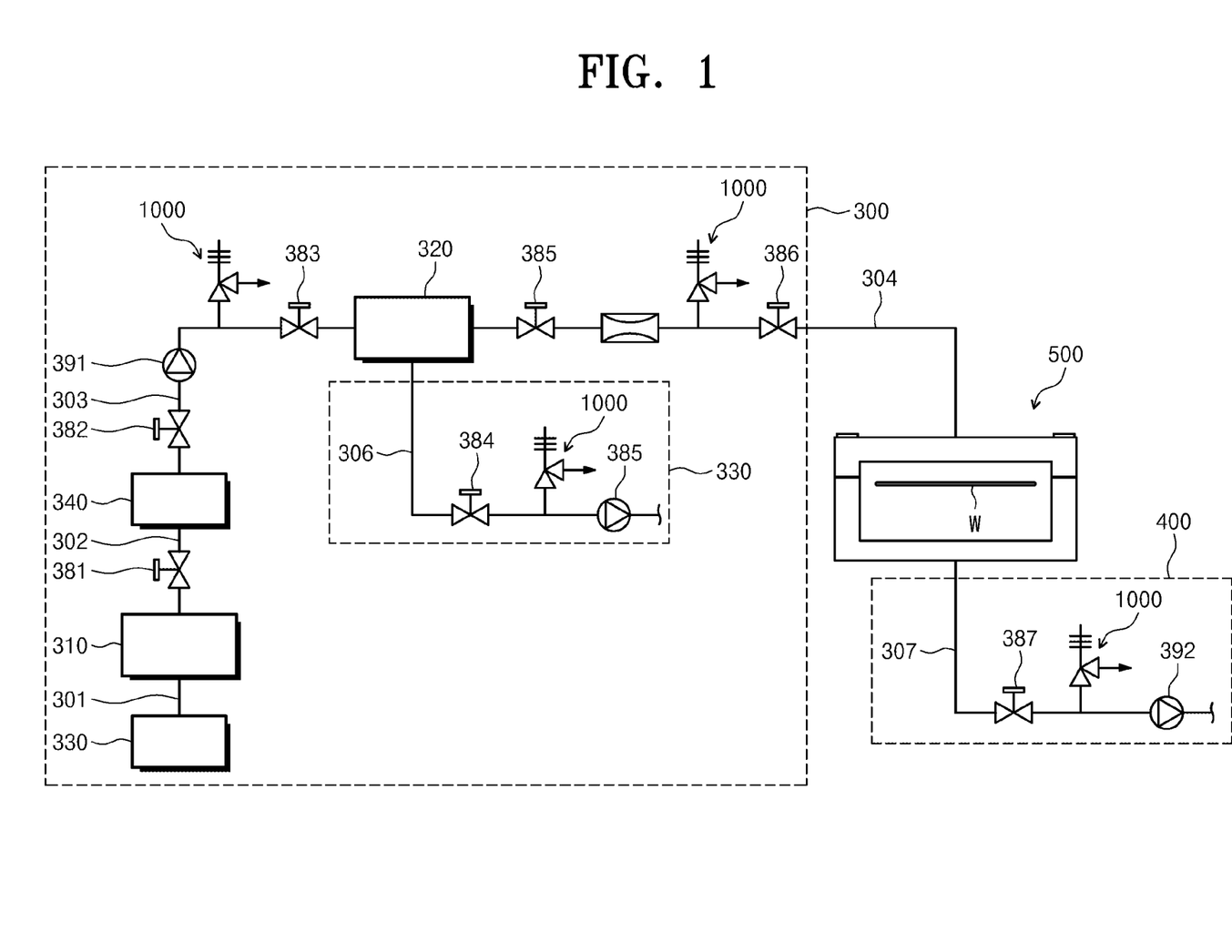
FIG. 1 is a view illustrating a flow of supercritical fluid supplied into and released from a high-pressure chamber 500.

FIG. 1 is a view illustrating a flow of supercritical fluid supplied into and released from a high-pressure chamber 500.

Referring to FIG. 1, the supercritical fluid is supplied into the high-pressure chamber 500 through a supercritical fluid supply unit 300 and released from the high-pressure chamber 500 through an exhaust unit 400.

The supercritical fluid supply unit 300 may include a storage tank 310, a reservoir tank 320, a first condenser 330, and a second condenser 340.

According to an embodiment, the supercritical fluid is supercritical carbon dioxide. Carbon dioxide is stored in a liquid state in the storage tank 310. The carbon dioxide may be supplied from the outside and stored in the storage tank 310. Alternatively, carbon dioxide released through the exhaust unit 400 may be regenerated and supplied into the storage tank 310. The carbon dioxide supplied from the outside or regenerated may contain gas. The first condenser 330 changes carbon dioxide from a gaseous state to a liquid state and supplies the carbon dioxide in the liquid state into the storage tank 310. A large amount of carbon dioxide may be stored in the storage tank 310 because carbon dioxide in a liquid state has a much smaller volume than carbon dioxide in a gaseous state. The first condenser 330 may be omitted.

The reservoir tank 320 temporarily stores carbon dioxide. Furthermore, the reservoir tank 320 may change carbon dioxide supplied from the storage tank 310 into supercritical fluid and may supply the supercritical fluid into the high-pressure chamber 500.

When a first valve 381 installed in a first supply pipe 302 that connects the storage tank 310 and the second condenser 340 is opened, the carbon dioxide stored in the storage tank 310 moves into the second condenser 340 while being changed to a gaseous state. The fluid flowing through the first supply pipe 302 may be high-pressure fluid, and the first supply pipe 302 may be implemented with a high-pressure pipe. A pump 391 may be installed in a second supply pipe 303 that connects the second condenser 340 and the reservoir tank 320. The second condenser 340 changes the carbon dioxide from the gaseous state to a liquid state, and the pump 391 compresses the carbon dioxide in the liquid state to a critical pressure or more and supplies the compressed liquid carbon dioxide into the reservoir tank 320. A second valve 382, a safety valve 1000, and a third valve 383 may be provided in the second supply pipe 303 that connects the second condenser 340 and the reservoir tank 320. The fluid flowing through the second supply pipe 303 may be high-pressure fluid, and the second supply pipe 303 may be implemented with a high-pressure pipe.

The reservoir tank 320 changes the supplied carbon dioxide into supercritical fluid by heating the supplied carbon dioxide to a critical temperature or more and supplies the supercritical fluid into the high-pressure chamber 500. At this time, the carbon dioxide released from the reservoir tank 320 may be in a state of being compressed to a pressure of 100 bar to 150 bar. The reservoir tank 320 may be provided with an exhaust unit 400 for adjusting the pressure in the reservoir tank 320. A fourth valve 384, a safety valve 1000, and an exhaust pump 385 may be installed in an exhaust pipe 306 of the exhaust unit 400.

A fifth valve 385, a safety valve 1000, and a sixth valve 386 may be provided in a third supply pipe 304 that connects the reservoir tank 320 and the high-pressure chamber 500. An orifice may be provided downstream of the fifth valve 385.

The high-pressure chamber 500 cleans or dries a substrate W using the supercritical fluid. The high-pressure chamber 500 will be described below in detail with reference to FIG. 2.

The exhaust unit 400 evacuates process fluid in the high-pressure chamber 500. The supercritical fluid in the high-pressure chamber 500 is evacuated outside the high-pressure chamber 500 through an exhaust pipe 307. A seventh valve 387, a safety valve 1000, and an exhaust pump 392 may be installed in the exhaust pipe 307.

In an embodiment, the safety valves 1000 may be provided in the third supply pipe 304 that connects the reservoir tank 320 and the high-pressure chamber 500, the second supply pipe 303 that connects the second condenser 340 and the reservoir tank 320, the exhaust pipe 306 of the exhaust unit 400 of the reservoir tank 320, and the exhaust pipe 307 of the exhaust unit 400 of the high-pressure chamber 500, respectively. The safety valves 1000 may be applied to all pipes in which a high pressure of 10 bar or more is provided, blow-off devices of tanks, and exhaust components. The safety valves 1000 are automatically opened when the pressures in the pipes exceed set pressures. Furthermore, when the pressures of fluids passing through the pipes exceed set allowable pressures, the safety valves 1000 lower the fluid pressures to the allowable pressures or less. When the pressures in the pipes are excessive, the safety valves 1000 connect the pipes to the outside and urgently discharge the fluids in the pipes to the outside. The safety valves 1000 will be described below in detail with reference to FIG. 3 and the following drawings.

Figure 2:
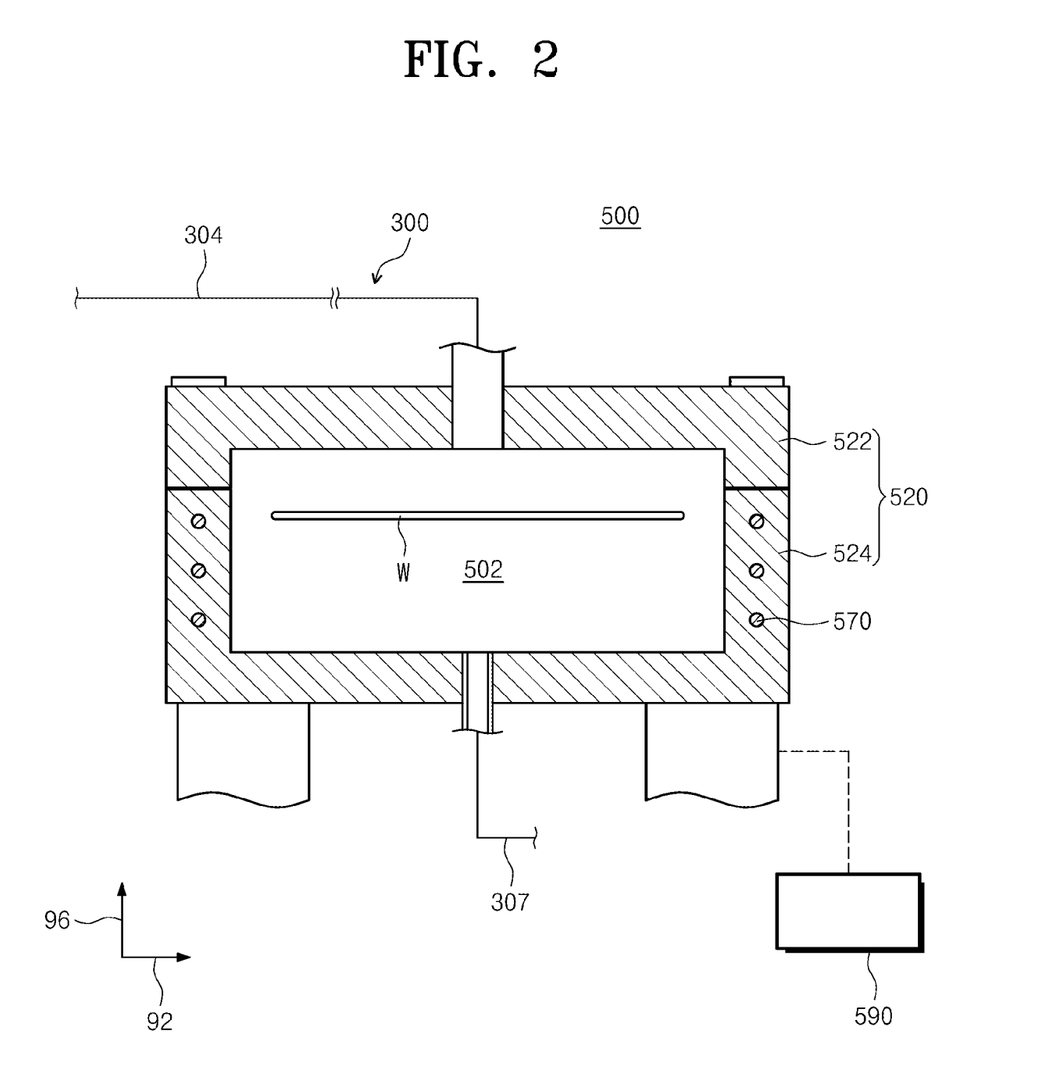
FIG. 2 is a schematic view illustrating an embodiment of the high-pressure chamber 500 of FIG. 1.

FIG. 2 is a schematic view illustrating an embodiment of the high-pressure chamber 500 of FIG. 1. According to an embodiment, the high-pressure chamber 500 cleans or dries a substrate W using supercritical fluid. The high-pressure chamber 500 has a body 520, a substrate support unit (not illustrated), the fluid supply unit 300, and a blocking plate (not illustrated).

The body 520 has an inner space 502 in which a treating process is performed. The body 520 has an upper body 522 and a lower body 524, and the upper body 522 and the lower body 2524 are combined with each other to form the inner space 502. The upper body 522 is located over the lower body 524. The upper body 522 may be fixed in position, and the lower body 524 may be raised or lowered by an actuator 590 such as a cylinder. When the lower body 524 is separated from the upper body 522, the inner space 502 is opened. At this time, the substrate W is carried into or out of the inner space 502. During a process, the lower body 524 is brought into close contact with the upper body 522 to seal the inner space 502 from the outside. The high-pressure chamber 500 has a heater 570. According to an embodiment, the heater 570 is located in a wall of the body 520. The heater 570 heats the inner space 502 of the body 520 to maintain the fluid in the inner space 502 of the body 520 in a supercritical state.

Meanwhile, although not illustrated in the drawing, the substrate support unit (not illustrated) that supports the substrate W may be provided in the inner space 502. The substrate support unit (not illustrated) supports the substrate W in the inner space 502 of the body 520. The substrate support unit (not illustrated) may be installed in the lower body 2524 to support the substrate W. In this case, the substrate support unit (not illustrated) may be in a form that raises and supports the substrate W. Alternatively, the substrate support unit (not illustrated) may be installed in the upper body 522 to support the substrate W. In this case, the substrate support unit (not illustrated) may be in a form in which the substrate W is suspended from the substrate support unit (not illustrated) and is supported thereby.

The fluid supply unit 300 supplies process fluid into the inner space 502 of the body 520. According to an embodiment, the process fluid may be supplied in a supercritical state into the inner space 502. Alternatively, the process fluid may be supplied in a gaseous state into the inner space 502 and may experience a phase change into a supercritical state in the inner space 502.

According to an embodiment, the third supply pipe 304 of the fluid supply unit 300 supplies the process fluid from above the substrate W placed on the substrate support unit (not illustrated). According to an embodiment, the third supply pipe 304 is coupled to the upper body 522. In addition, the third supply pipe 304 may be coupled to the center of the upper body 522.

Alternatively, the third supply pipe 304 may be split into an upper branch pipe (not illustrated) that is connected to the upper body 522 and a lower branch pipe (not illustrated). The lower branch pipe (not illustrated) may be coupled to the lower body 524. The upper branch pipe (not illustrated) and the lower branch pipe (not illustrated) may each have a flow valve installed therein.

The exhaust pipe 307 is coupled to the lower body 524. The supercritical fluid in the inner space 502 of the body 520 is evacuated outside the body 520 through the exhaust pipe 307.

In the case where the lower branch pipe (not illustrated) is coupled to the lower body 524, the blocking plate (not illustrated) may be disposed in the inner space 502 of the body 520. The blocking plate (not illustrated) may have a circular plate shape. The blocking plate (not illustrated) is supported by supports (not illustrated) so as to be spaced apart upward from a bottom surface of the body 520. The supports (not illustrated) have a rod shape and are spaced apart from each other by a predetermined distance. An outlet of the lower branch pipe (not illustrated) and an inlet of the exhaust pipe 307 may be provided in positions that do not interfere with each other. The blocking plate (not illustrated) may prevent the process fluid supplied through the lower branch pipe (not illustrated) from being directly dispensed toward the substrate W to damage the substrate W.

Figure 3:
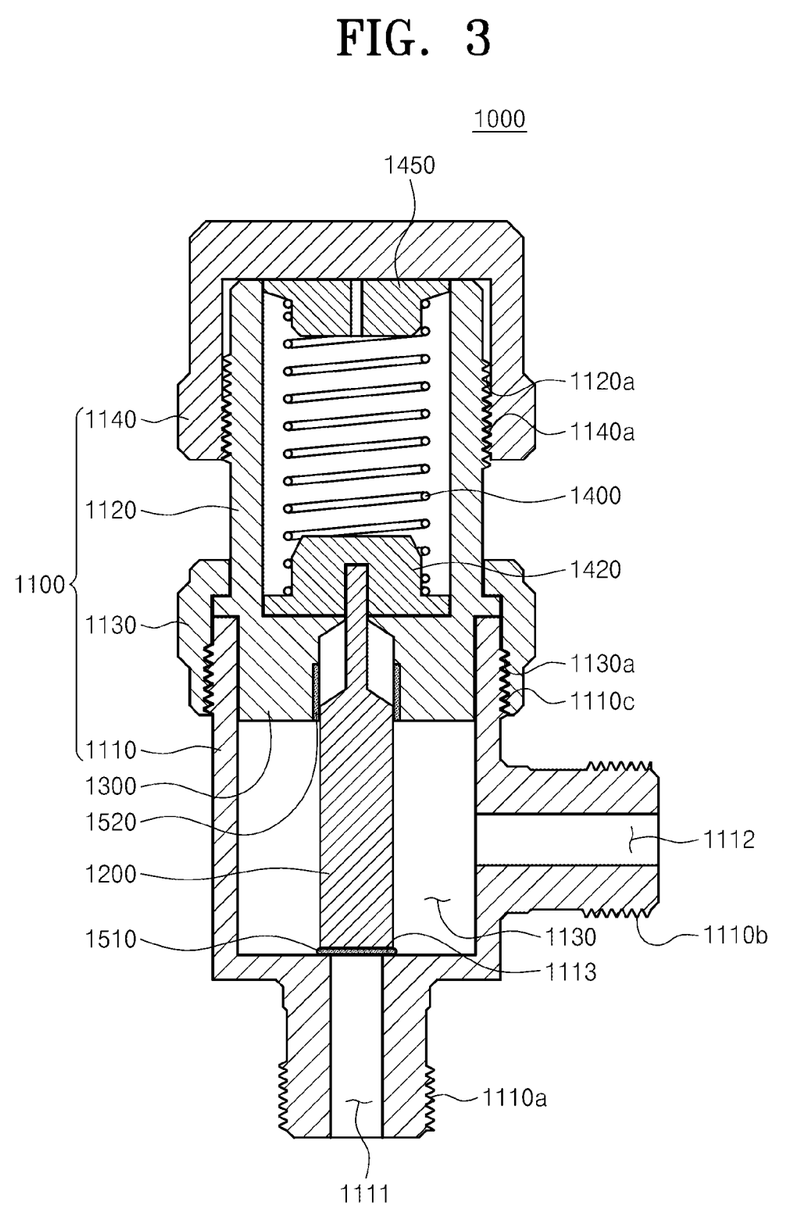
FIG. 3 is a schematic sectional view of a safety valve 1000 according to an embodiment.

FIG. 3 is a schematic sectional view of the safety valve 1000 according to an embodiment.

Referring to FIG. 3, the safety valve 1000 includes a valve body 1100, a disc 1200, a disc guide 1300, and an elastic member 1400.

The valve body 1100 forms the exterior of the safety valve 1000. The valve body 1100 includes a main body (a first body) 1110, a cylinder body (a second body) 1120, a first cap 1130, and a second cap 1140.

The main body 1110 includes a primary inlet 1111 and a secondary outlet 1112. A thread 1110a for connection with a primary pipe is formed around the primary inlet 1111. A thread 1110b for connection with a secondary pipe is formed around the secondary outlet 1112. In an embodiment, the primary pipe is one of the supply pipes of the fluid supply unit, and the secondary pipe is a branch pipe that branches off from the pipe.

The main body 1110 is combined with the cylinder body 1120. The main body 1110 and the cylinder body 1120 may be combined by the first cap 1130. The first cap 1130 may be threaded onto the main body 1110. The main body 1110 has a thread 1110c formed thereon. The first cap 1130 has a thread 1130a corresponding to the thread 1110c.

The elastic member 1400 is mounted in the cylinder body 1120. The elastic member 1400 is supported by a first supporter 1420 and a second supporter 1450. The first supporter 1420 supports the disc 1200 and transmits the elastic force of the elastic member 1400 to the disc 1200. The second supporter 1450 is supported on the second cap 1140. The second cap 1140 may be threaded onto the cylinder body 1120. The cylinder body 1120 has a thread 1120a formed on the outer surface thereof. The second cap 1140 has a thread 1140a corresponding to the thread 1120a.

The threads 1110a, 1110b, 1110c, 1120a, 1130a, and 1140a of the safety valve 1000 may be plated with silver. Lubricant for the safety valve 1000 may be removed because the coupling portions and the friction surfaces are plated with silver. A cavity 1130 is formed between the primary inlet 1111 and the secondary outlet 1112. The disc 1200 is provided in the cavity 1130.

The disc 1200 is opposite the primary inlet 1111. The disc 1200 opens or closes the primary inlet 1111. The disc 1200 has a rod shape. A valve seat 1113 is provided at the primary inlet 1111 of the main body 1110. One side of the disc 1200 is brought into contact with the valve seat 1113 to close the primary inlet 1111. The disc 1200 vertically moves with respect to the contact surface with the valve seat 1113.

A first sealing member 1510 is coupled to the one side of the disc 1200. The first sealing member 1510 is implemented with a seat in a circular plate shape. Alternatively, the first sealing member 1510 is implemented with a seat in a doughnut shape. The first sealing member 1510 is made of polyimide. The polyimide does not swell in supercritical fluid.

An opposite side of the disc 1200 is coupled to the first supporter 1420. The elastic member 1400 exerts elastic force on the disc 1200 coupled with the first supporter 1420. According to an embodiment, the elastic member 1400 may be a spring. The first supporter 1420 is elastically supported by the elastic member 1400. The first supporter 1420 may reciprocate in the cylinder body 1120. The disc 1200 moves together with the first supporter 1420.

The disc guide 1300 supports the disc 1200 and guides the direction of movement of the disc 1200. The surface of the disc 1200 may be plated with silver. The surface of the disc guide 1300 with which the disc 1200 is brought into contact may be plated with silver. Lubricant provided in the safety valve 1000 may be eliminated because the friction surfaces between the disc 1200 and the disc guide 1300 are plated with silver. A second sealing member 1520 may be provided on the disc guide 1300. The second sealing member 1520 may be implemented with a film. The second sealing member 1520 is made of polyimide. The polyimide does not swell in supercritical fluid.

In a process of making contact with supercritical fluid, a rubber sealing member in the related art swells to contaminate the supercritical fluid. However, the first sealing member 1510 and the second sealing member 1520 according to the embodiment do not swell in supercritical fluid. Accordingly, the contamination of the supercritical fluid caused by decomposition of the sealing member itself is prevented. In particular, a safety valve is automatically operated by a flow of fluid rather than external force, and therefore lubricant is used as an essential component. The swelled sealing member fails to perform a sealing function, and the lubricant therein is introduced into a facility. The lubricant introduced into the facility causes a process failure due to oil. However, the safety valve 1000 according to the embodiment may prevent the process failure caused by the lubricant.

Lubricant may be completely eliminated because the friction surfaces of the threads 1110a, 1110b, 1110c, 1120a, 1130a, and 1140a and the disc 1200 of the safety valve 1000 according to the embodiment are plated with silver. Accordingly, a process failure caused by lubricant may be prevented.

Figure 4:
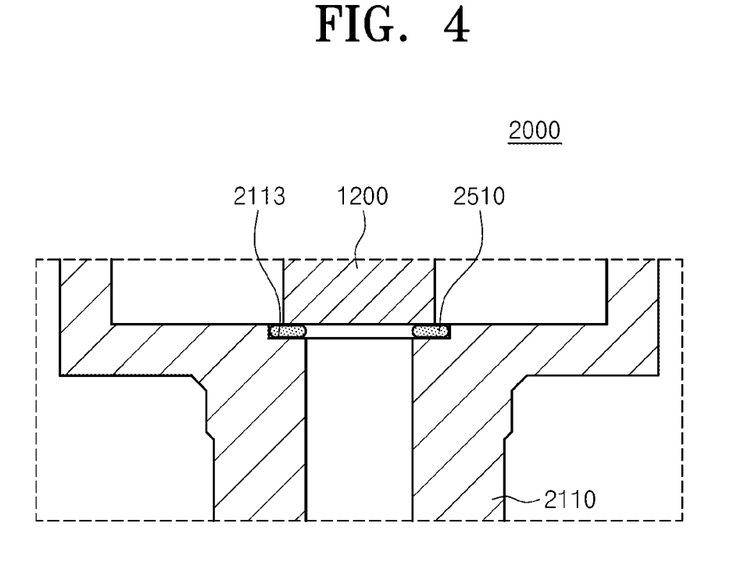
FIG. 4 is a schematic sectional view of a safety valve 2000 according to another embodiment.

FIG. 4 is a schematic sectional view of a safety valve 2000 according to another embodiment. A valve seat 2113 is concavely formed on a main body 2110 of the safety valve 2000. A first sealing member 2510 implemented with a seat in a doughnut shape is mounted on the valve seat 2113. The first sealing member 2510 is made of polyimide. Components other than the components described are identical to those in the embodiment of FIG. 3.

Figure 5:
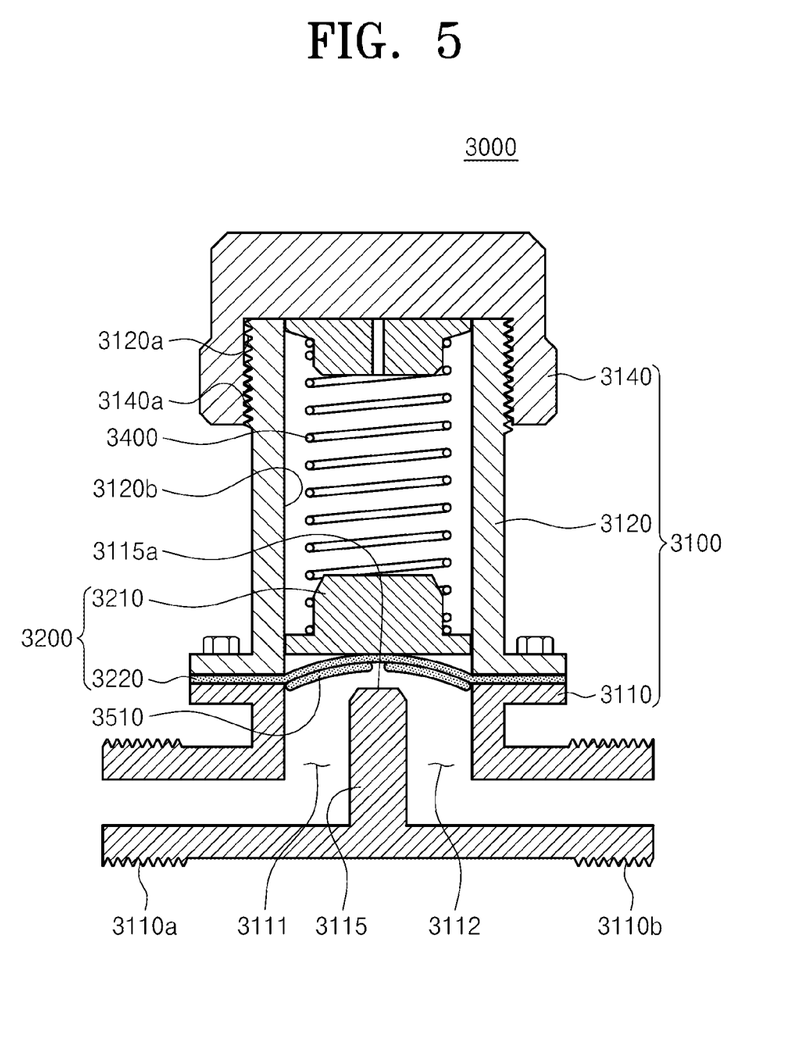
FIG. 5 is a schematic sectional view of a safety valve 3000 according to another embodiment.

FIG. 5 is a schematic sectional view of a safety valve 3000 according to another embodiment.

A main body 3110 of the safety valve 3000 has a primary inlet 3111 and a secondary outlet 3112 formed therein. A disc 3200 includes a disc body 3210 and a diaphragm 3220. The primary inlet 3111 and the secondary outlet 3112 are perpendicular to the diaphragm 3220, with a partition wall 3115 therebetween.

The diaphragm 3220 separates the interior of a cylinder body 3120 and the interior of the main body 3110 from each other. A first sealing member 3510 is coupled to the diaphragm 3220. The first sealing member 3510 is implemented with a doughnut-shaped seat made of polyimide.

An upper portion of the partition wall 3115 makes contact with the diaphragm 3220 and opens or closes a flow passage. The disc body 3210 makes contact with the diaphragm 3220 and transmits the elastic force of an elastic member 3400 to the diaphragm 3220. The diaphragm 3220 is preferably made of polyimide.

The diaphragm 3220 is moved toward the interior of the cylinder body 3120 by the pressure of fluid. Alternatively, as the elastic member 3400 pushes the disc body 3210 by a resilient restoring force thereof, the diaphragm 3220 may closely approach an upper surface 3115a of the partition wall 3115 and may move in the direction of closing the flow passage.

Figure 6:
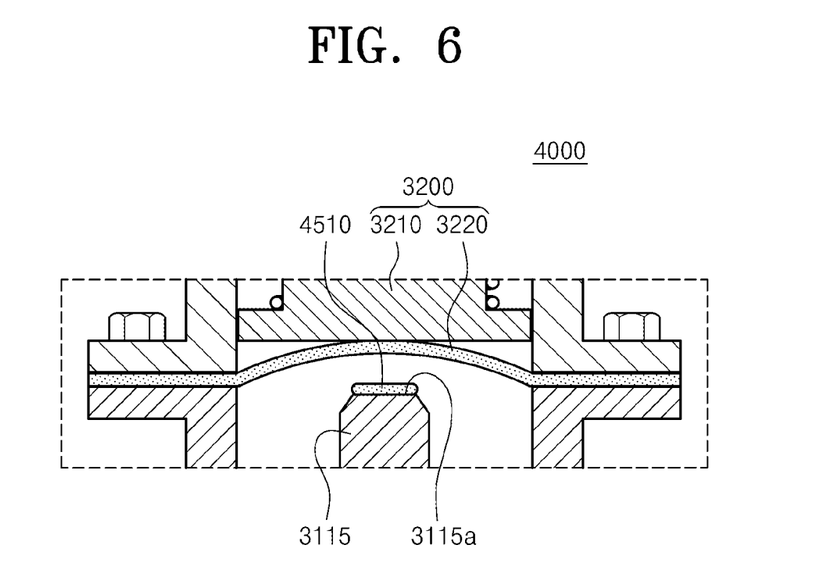
FIG. 6 is a schematic sectional view of a safety valve 4000 according to another embodiment.

FIG. 6 is a schematic sectional view of a safety valve 4000 according to another embodiment. Unlike in the embodiment of FIG. 5, a first sealing member 4510 of the safety valve 4000 may be provided on the upper surface 3115a of the partition wall 3115.

According to the embodiments of the inventive concept, a substrate may be efficiently treated.

Furthermore, according to the embodiments of the inventive concept, efficiency in cleaning a substrate may be improved.

In addition, according to the embodiments of the inventive concept, a process failure caused by oil leakage from a safety valve may be reduced.

Effects of the inventive concept are not limited to the aforementioned effects, and any other effects not mentioned herein may be clearly understood from this specification and the accompanying drawings by those skilled in the art to which the inventive concept pertains.

The above description exemplifies the inventive concept. Furthermore, the above-mentioned contents describe exemplary embodiments of the inventive concept, and the inventive concept may be used in various other combinations, changes, and environments. That is, variations or modifications can be made to the inventive concept without departing from the scope of the inventive concept that is disclosed in the specification, the equivalent scope to the written disclosures, and/or the technical or knowledge range of those skilled in the art. The written embodiments describe the best state for implementing the technical spirit of the inventive concept, and various changes required in specific applications and purposes of the inventive concept can be made. Accordingly, the detailed description of the inventive concept is not intended to restrict the inventive concept in the disclosed embodiment state. In addition, it should be construed that the attached claims include other embodiments.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. An apparatus for treating a substrate, the apparatus comprising:
    a high-pressure chamber having a treating space in which the treating of the substrate by a supercritical fluid is performed;
    a fluid supply unit including a supply pipe through which the supercritical fluid is supplied into the high-pressure chamber;
    at least one branch pipe branching off from the supply pipe of the fluid supply unit, the at least one branch pipe being configured to discharge the supercritical fluid to an outside; and
    a safety valve provided between the supply pipe and the at least one branch pipe, and configured to release pressure in the supply pipe to the at least one branch pipe when the pressure in the supply pipe exceeds an allowable pressure,
    wherein the safety valve includes:
        a first sealing member;
        a second sealing member,
        an inlet connected to the supply pipe;
        a disc opening and closing the inlet; and
        a disc guide,
    wherein, in a longitudinal of the disc, the first sealing member is disposed between the disc and the inlet such that the first sealing member is disposed on an end surface of the disc that faces the inlet,
    wherein the disc guides comprises a groove guiding a direction of a movement of the disc,
    wherein the second sealing member is disposed at a side of the groove, and
    wherein the first sealing member extends on an entirety of the end surface of the disc.

2. The apparatus of claim 1, wherein the safety valve further includes:
   a body including a flow passage formed therein, the flow passage including the inlet connected to the supply pipe and an outlet connected to the at least one branch pipe, wherein a valve seat is formed around the inlet or the outlet, and
      wherein one side of the disc is in contact with the valve seat; and
   an elastic member connected to an opposite side of the disc and configured to elastically support the disc, the elastic member having a set elasticity,
   wherein the first sealing member and the second sealing member include polyimide, and
   wherein, in an axial direction of the disc, the first sealing member is provided on contact surfaces of the disc and the valve seat when the pressure in the supply pipe is equal to or less than the allowable pressure.

3. The apparatus of claim 2, wherein the body of the safety valve further includes a first body in which the flow passage is formed and a second body including the elastic member therein,
   wherein the first body is screw-coupled with the second body, and
   wherein screw-coupling surfaces of the first body and the second body are plated with silver.

4. The apparatus of claim 3, wherein lubricant is not applied to the safety valve.

5. The apparatus of claim 2, wherein, in the contact surfaces of the disc and the body, at least one of the disc and the body is plated with silver.

6. The apparatus of claim 2, wherein the first sealing member is provided in a shape based on a shape of the valve seat.

7. The apparatus of claim 2, wherein the first sealing member is configured to be coupled to the valve seat.

8. The apparatus of claim 2, wherein the disc vertically moves with respect to a contact surface with the valve seat such that, in the axial direction of the disc, the disc overlaps with the valve seat.

9. The apparatus of claim 1, wherein the safety valve further includes:
   a primary coupling part coupled to the supply pipe; and
   a secondary coupling part coupled to the at least one branch pipe, and
   wherein the primary coupling part and the secondary coupling part are plated with silver.

10. The apparatus of claim 1, wherein the safety valve further includes at least one thread, and
   wherein a surface of the at least one thread is plated with silver.

11. The apparatus of claim 1, wherein lubricant is not applied to the safety valve.

12. A safety valve applied to a high-pressure pipe through which high-pressure fluid flows and configured to discharge the high-pressure fluid in the high-pressure pipe to an outside when pressure in the high-pressure pipe is higher than or equal to a set pressure, the safety valve comprising:
   a first sealing member,
   a second sealing member;
   an inlet connected to the high-pressure pipe;
   a disc opening and closing the inlet, and
   a disc guide,
   wherein, in a longitudinal axis of the disc, the sealing member is disposed between the disc and the inlet such that the sealing member is disposed on an end surface of the disc that faces the inlet,
   wherein the disc guide comprises a groove guiding a direction of a movement of the disc,
   wherein the second sealing member is disposed at a side of the groove, and
   wherein the first sealing member extends on an entirety of the end surface of the disc.

13. The safety valve of claim 12, wherein the high-pressure pipe includes a pipe through which a supercritical fluid flows.

14. The safety valve of claim 12, wherein the safety valve further includes:
   a body including a flow passage formed therein, the flow passage including the inlet and an outlet,
      wherein a valve seat is formed around the inlet or the outlet, and
      wherein one side of the disc is in contact with the valve seat; and
   an elastic member connected to an opposite side of the disc and configured to elastically support the disc, the elastic member having a set elasticity,
   wherein the first and second sealing member includes polyimide, and
   wherein, in an axial direction of the disc, the first sealing member is provided on contact surfaces of the disc and the valve seat when the pressure in the high-pressure pipe is equal to or less than an allowable pressure.

15. The safety valve of claim 14, wherein the disc vertically moves with respect to a contact surface with the valve seat such that, in the axial direction of the disc, the disc overlaps with the valve seat.

16. The safety valve of claim 14, wherein the body includes a first body in which the flow passage is formed and a second body including the elastic member therein,
   wherein the first body is screw-coupled with the second body, and
   wherein screw-coupling surfaces of the first body and the second body are plated with silver.

17. The safety valve of claim 14, wherein in the contact surfaces of the disc and the body, at least one of the disc and the body is plated with silver.

18. The safety valve of claim 12, wherein the safety valve further includes at least one thread, and
   wherein a surface of the at least one thread is plated with silver.

19. The safety valve of claim 12, wherein lubricant is not applied to the safety valve.

* * * * *